United States Patent [19]

Cowley

[11] Patent Number: 4,792,989
[45] Date of Patent: Dec. 20, 1988

[54] TUNER CIRCUITS AND VOLTAGE GENERATORS THEREFOR

[75] Inventor: Nicholas P. Cowley, Wiltshire, England

[73] Assignee: Plessey Overseas Limited, Ilford, England

[21] Appl. No.: 18,216

[22] Filed: Feb. 24, 1987

[30] Foreign Application Priority Data

Feb. 25, 1986 [GB] United Kingdom ................. 8604652

[51] Int. Cl.$^4$ ............................................. H04B 1/26
[52] U.S. Cl. .................................. 455/195; 455/183; 334/15
[58] Field of Search ............... 455/169, 179, 180, 185, 455/186, 195, 183; 334/15, 64; 358/191.1

[56] References Cited
U.S. PATENT DOCUMENTS 4,365,348 12/1982 Fujimoto ............................ 455/180
4,368,541 1/1983 Evans .................................. 455/186
4,646,360 2/1987 Muterspaugh ...................... 455/195
4,710,993 12/1987 Suzuki ................................ 455/195

FOREIGN PATENT DOCUMENTS 55-55616 4/1980 Japan .................................. 455/195
1450964 9/1976 United Kingdom .

Primary Examiner—Robert L. Griffin
Assistant Examiner—Curtis A. Kuntz
Attorney, Agent, or Firm—Michael F. Oglo; Julian C. Renfro

[57] ABSTRACT

In a tuner circuit, the relatively high voltage used to control a varactor diode of the circuit is derived using a cascade of resistors and transistors under the control of a reference voltage input. The breakdown voltage of each transistor is significantly less than the output voltage of the cascade and is such that the cascade can be implimented in the same semiconductor chip as high frequency, low voltage process, synthesiser components.

6 Claims, 5 Drawing Sheets

TUNER CIRCUITS AND VOLTAGE GENERATORS THEREFOR

BACKGROUND OF THE INVENTION

1. Field of the Invention

The present invention relates to voltage generators and more particularly to voltage generators suitable for generating accurate voltages for use in the tuning control circuitry of radio or television apparatus.

At present most T.V. tuners use digital frequency synthesis to generate the local oscillator varactor voltage for obtaining the correct LO frequency. This synthesiser is frequently required to function up to 1.3 GHz., and a known design uses a single chip synthesiser with external high voltage components.

This synthesised voltage as well as driving the LO varactor is also required to drive the varactors in the image rejection filters prior to the down-conversion stage. Since these filters must accurately track with the LO then the varactors must be well matched to each other which is a costly and time consuming task.

2. Description of Related Art

Present proposed systems for overcoming these problems utilize a procedure called auto-alignment. In this system the varactors, which undergo only a very coarse selection procedure, are each driven by their own high voltage line therefore an error voltage can be introduced so aligning each varactor accurately. The required error voltage can be easily monitored and recorded during alignment procedure and then stored and used as required by the microprocessor which controls the digital synthesis loop, a procedure known as static auto-alignment; or the required error voltage can be set up on each reprogram of the tuner by a series of dynamic algorithms, controlled by the microprocessor, the so called dynamic auto-alignment procedure.

A typical system would use the synthesis loop as at present to generate the LO varactor voltage. The prefilter varactor voltages are then obtained by adding an error voltage +dV to the synthesised voltage V, which is normally in the range 0 to 30V.

For optimum integration of the synthesiser system these high voltage outputs and their associated voltage differencing circuitry need to be integrated with the high frequency processing circuitry.

This is disadvantageous since the high frequency process required to produce the 1.3 GHz., synthesiser will inherently have a low breakdown voltage e.g. for a typical process BV is approx. 10V, which is much lower than that required by the high voltage sections.

SUMMARY OF THE INVENTION

It is an object of the present invention to provide high voltage generation and voltage differencing circuitry suitable for T.V. tuners using high frequency low voltage process components.

According to the present invention there is provided a voltage generator for a T.V. tuner including transistorised control means for generating an accurate output voltage relative to a reference voltage in which the output voltage is in excess of the normal breakdown voltage of the transistors within the transistorised control means.

BRIEF DESCRIPTION OF THE DRAWINGS

Embodiments of the present invention will now be described, by way of example with reference to the accompanying drawings in which.

DESCRIPTION OF A PREFERRED EMBODIMENT

Figure 1:
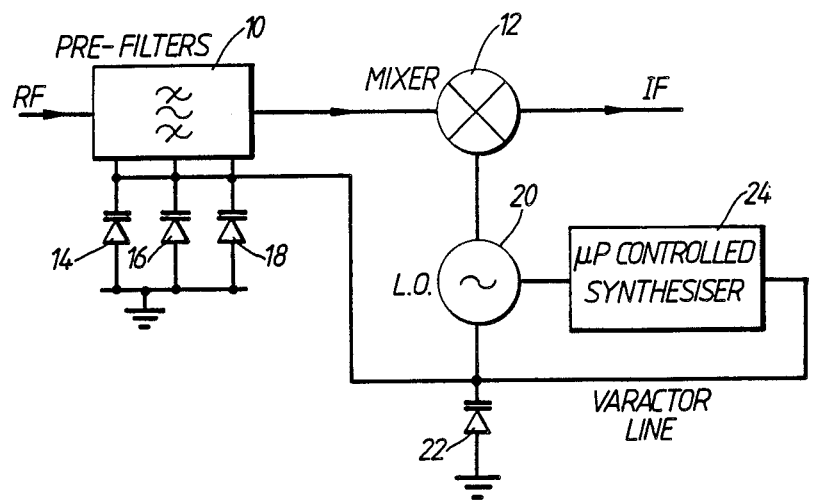
FIG. 1 shows in a simplified format a known T.V. tuner.

With reference now to FIG. 1 in a known system the incoming RF signal is passed through a pre-filter stage 10 and then through a mixer 12 to the IF stages in known manner. The pre-filter stage 10 is controlled by varactor diodes 14, 16, 18 and the mixer 12 by a local oscillator 20 which is controlled firstly by a further varactor 22 and by a microprocessor controlled synthesiser 24. Varactor diodes 14, 16, 18 and 22 are therefore fed (as described in the introduction) with the same voltage with the described disadvantages.

Figure 2:
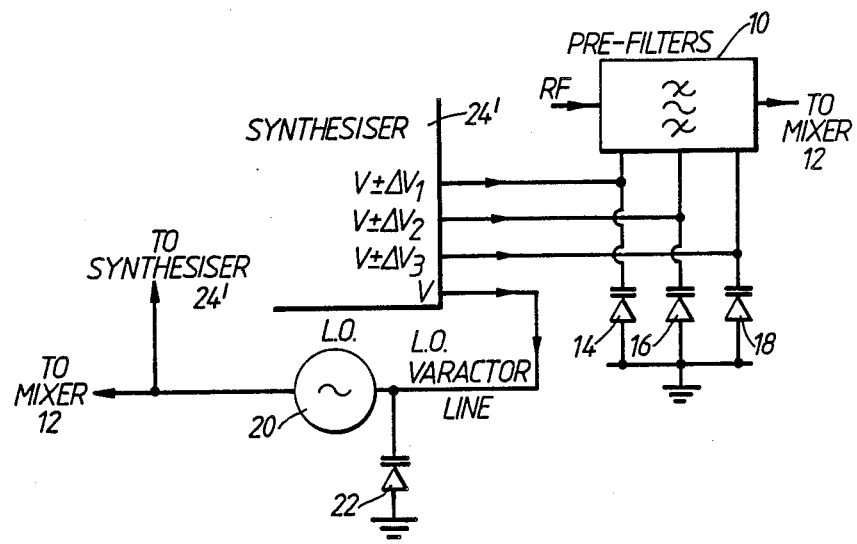
FIG. 2 shows in a simplified format a T.V. tuner for use with the voltage generator according to the present invention.

In FIG. 2 the varactor diodes 14, 16, 18 are fed with individual control voltage V+ V1; V+ V2 and V+ V3 generated in synthesiser 24'. The diodes can therefore be fed with selected control voltages to produce the correct frequencies.

These voltages are presently provided by the use of high voltage summing e.g., amplifiers produced on a high voltage process, Philip's CITAL system. However a high voltage process is not capable of producing high frequency components, which are required to produce a single chip frequency synthesiser. A high frequency process has low breakdown votlages, e.g., 7V, and is therefore not suited to producing a 30V direct summing amplifier as used in the Philip's system.

The present invention provides a voltage generator for the generation of these voltages which is compatible with a low breakdown voltage process. The design of the circuit will now be explained in stages.

Figure 3:
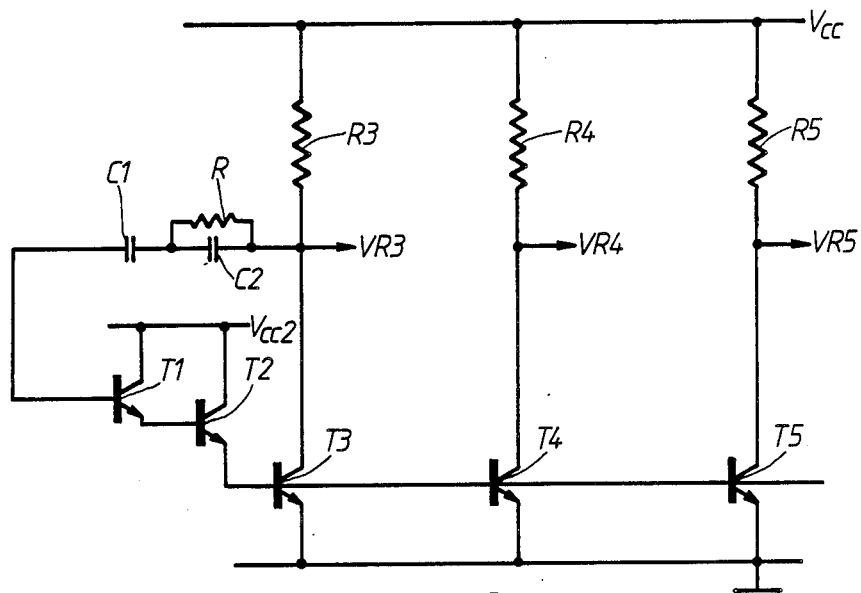
FIG. 3 illustrates a technique for generating matched voltage outputs using high voltage transistors.

FIG. 3 demonstrates the technique for generating matched voltage outputs using high voltage transistors. The loop amplifier comprising T1, T2 sets up matched Vbe voltages across T3, T4, T4 etc., and therefore providing the transistors are well matched then this will set up matched collector currents and so generate matched voltage drops across R3, R4, R5 etc. VR3 is then used as the feedback node through loop filter comprising C1, C2, R which maintains the input level to the loop amplifier and so the Vbe voltage.

The absolute accuracy of the voltage matching depends on the dVbe matching between the transistors T3, T4 etc., and therefore normal design techniques must be used to ensure good Vbe matching.

Figure 4:
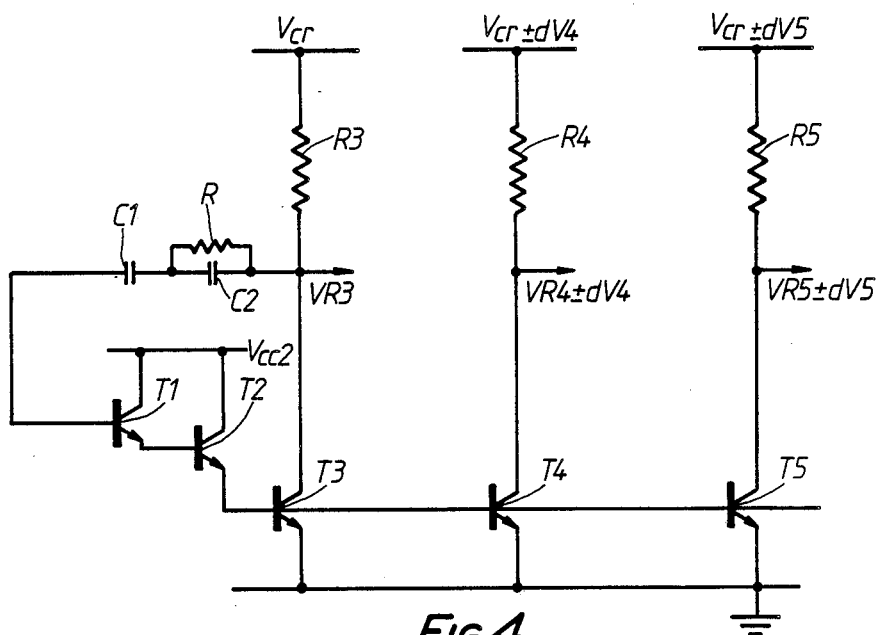
FIG. 4 illustrates a technique for adding an error voltage to the matched voltages.

FIG. 4 demonstrates the technique for adding an error voltage to the matched voltages VR4, VR5 in FIG. 3. As already described the collector currents will be matched as will the voltage drops across R4, R5 etc. Now only VR3 is servoed to the loop amplifier so it is possible to modify VR4, VR5 etc., by modifying the supply voltage Vcr±dV4 etc., and therefore VR4 will modify by an amount equal to dV4 with respect to VR3.

Figure 5:
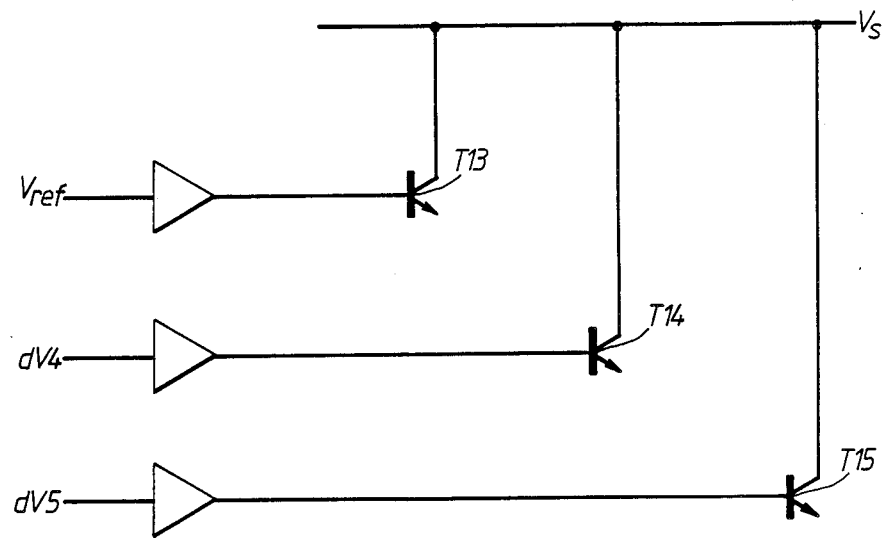
FIG. 5 illustrates a technique for generating various voltages.

FIG. 5 demonstrates the technique for generating the supply voltage Vcr, Vcr±dV4 etc. As T13, T14 etc., are voltage followers then the voltages at their emitters are effective voltage sources whose voltage levels are a Vbe down on the input voltages Vref, dV4 etc. Now Vref, dV4 etc., are referred to supply Vs and Vref is equal to dVmax./2 where dVmax is the difference between the maximum excursion levels in both the positive and negative directions. It can therefore be seen that it is possible to generate a servoed local oscillator varactor line voltage and n matched varactor line drives, (VR4, VR5 etc.,) whose absolute voltage levels can be modulated by up to dVmax/2 in a positive and negative direction.

Figure 6:
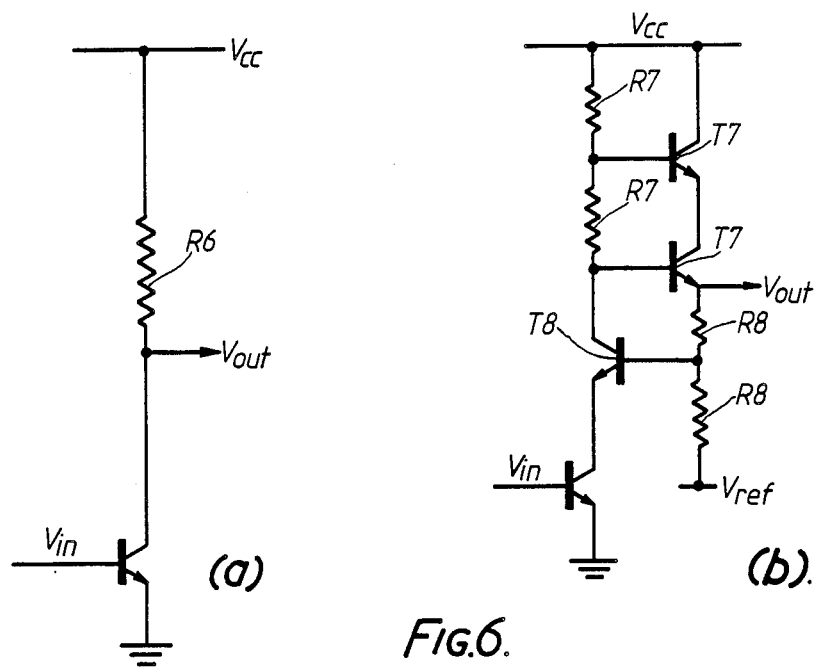
FIGS. 6a and 6b shows respectively high and low voltage cascade circuits.

Standard cascase design techniques are used to generate the high voltage capability from low voltage components. FIG. 6 shows an example conversion for the high voltage component circuit (FIG. 6a) and the low voltage equivalent (FIG. 6b). The cascading arrangement limits the maximum collector emitter voltage seen by any of the components, therefore the only design constraint on the number of transistors either side of the crossover point is that under maximum voltage no transistor shall see more than it's breakdown voltage.

Figure 7:
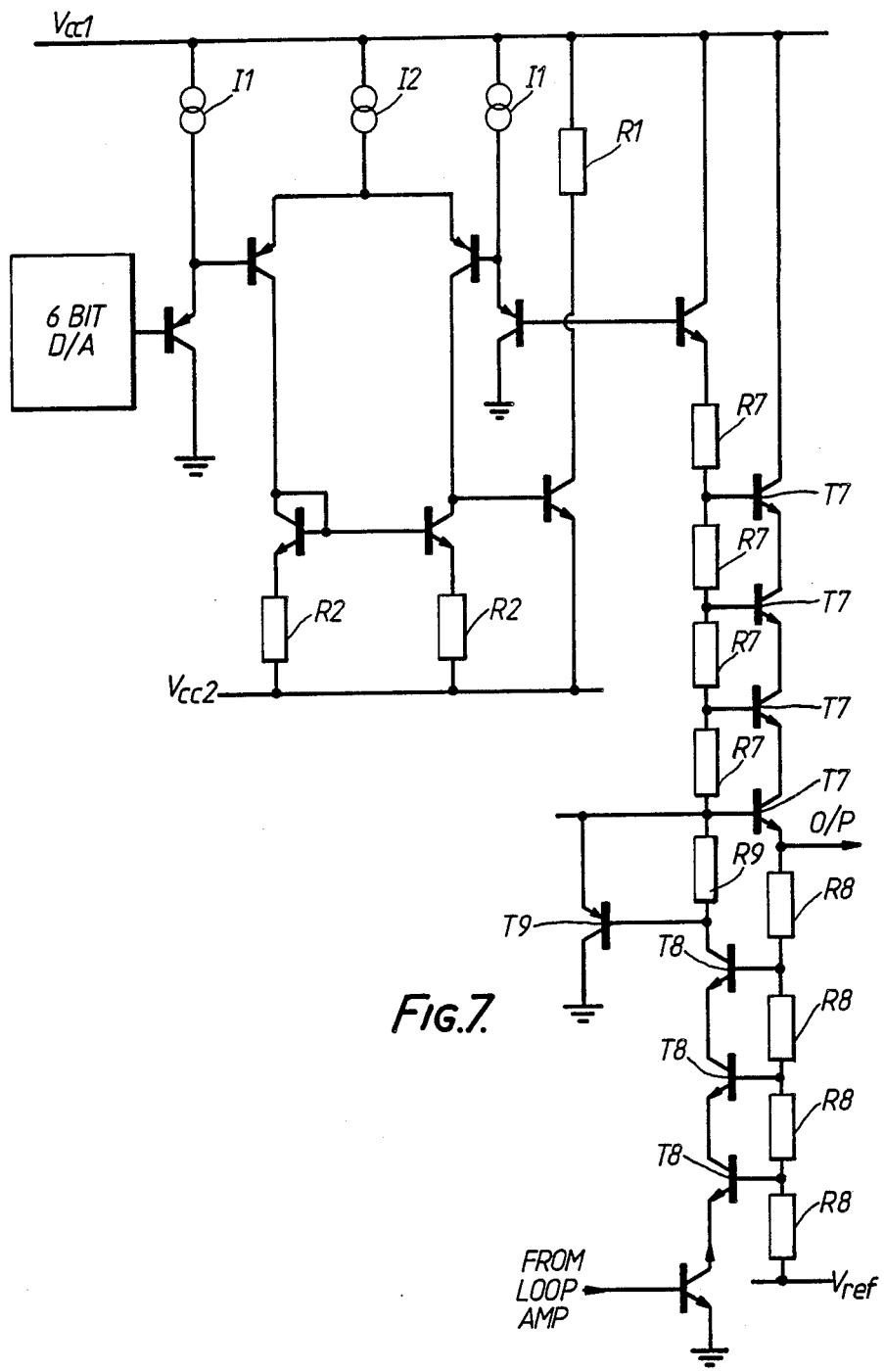
FIG. 7 shows an embodiment according to the present invention for generating a required output voltage; and, FIG. 8 shows in block diagram form a possible embodiment of a circuit according to the present invention for the generation of a plurality of voltage outputs for use in a T.V. control system.

With reference to FIG. 7 a practical circuit implimentation is demonstrated and, as can be seen by inspection, none of the components T7, T8 see more than Vs/4 and since in this design Vs is 35V and breakdown voltage is 10V then no component T7, T8 sees more than it's breakdown voltage.

Optionally a transistor T9 and a resistor R9 may be added to the transistor-resistor cascade T7, R7, T8, R8. This can be advantageous since they will act to minimise the effect of transistor β within the circuit.

Figure 8:
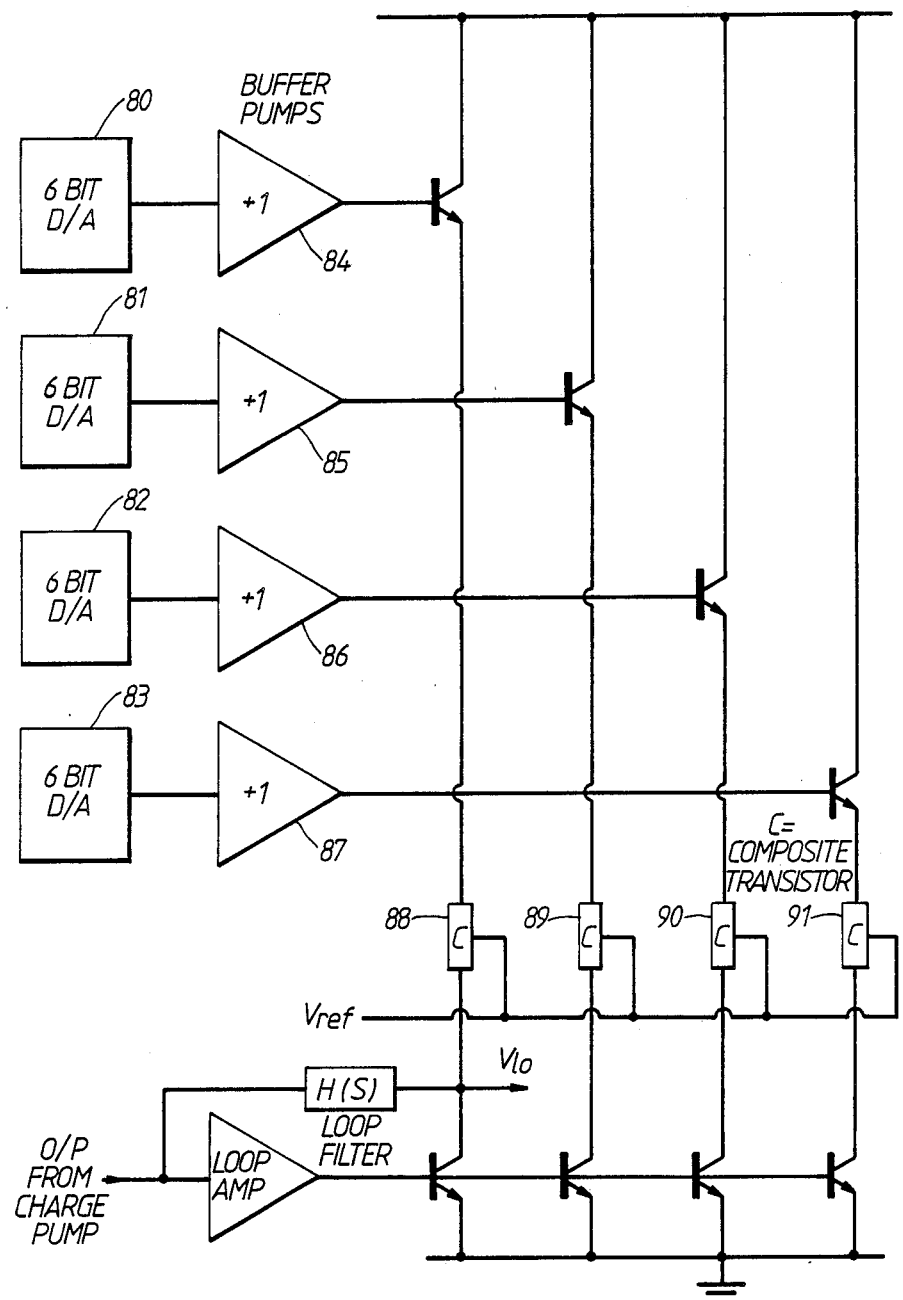

A block diagram for a circuit to generate a plurality of desired voltages is shown in FIG. 8. The "value" of the voltages is held in a plurality of D to A circuits 80, 81, 82, 83 and the output of each thereby representing the required voltage. Each output is fed to a circuit as shown in FIG. 7 and is thereby buffer amplified in a respective amplifier 84, 85, 86, 87 and fed to respective composite transistors 88, 89, 90, 91 to produce (as shown in detail in FIG. 7) a desired output. The inventive arrangement is advantageous in that:

(1) it uses only standard structures available on current high speed processes;

(2) simple system design;

(3) it enables use of a simple current sourced npn D/A convertor which will have good linearity;

(4) it enables complete integration of an auto-align compatible synthesiser containing the PLL (or FLL), D/A convertors and the high voltage varactor line drive outputs;

(5) it enables easy selection of dV window;

(6) removes need for lateral pnp transistors, which have poor current gains, in critical positions;

(7) line voltages simply disabled to either high or low for dynamic alignment procedure.

I claim:

1. A tuner circuit comprising:
    a mixer having a reference input, a signal input and a signal output;
    a local oscillator connected to the reference input of said mixer;
    a varactor diode in the local oscillator, for controlling the frequency thereof; and,
    a synthesiser, including high frequency low voltage process components, responsive to said local oscillator, and, arranged to supply a control voltage to said varactor diode; and
    a voltage generator, integrated as part of said synthesiser in a common semiconductor chip, which voltage generator includes: a first series of resistive elements;
    a first series of transistors, the control electrodes of which transistors are connected to corresponding ones of said resistive elements;
    a second series of transistors connected in series with said first series of resistive elements; and,
    a second series of resistive elements connected in series with said first series of transistors, respective resistive elements thereof being connected to respective control electrodes of said second series of transistors, the last resistive element thereof being connected to receive a reference voltage; whereby, said control voltage is made available at, or near the connection between said first series of transistors and said second series of resistive elements.

2. A tuner circuit, as claimed in claim 1, wherein first and second series transistors are all high frequency, low voltage process, npn bipolar transistors.

3. A tuner circuit, as claimed in claim 1, wherein a resisitive element and a transistor parallel therewith are interposed between said first series of resistive elements and said second series of transistors.

4. A tuner circuit, as claimed in claim 1, including
    a buffer amplifier preceding said first series of resistive elements; and,
    a digital to analogue converter arranged to feed said buffer amplifier.

5. A tuner circuit comprising:
    a mixer having a reference input, a signal input and a signal output;
    a local oscillator connected to the reference input of said mixer;
    a varactor diode in the local oscillator, for controlling the frequency thereof;
    a filter;
    at least one additional varactor diode, in said filter, to control the same; and,
    a synthesiser, including high frequency low voltage process components, responsive to said local oscillator, arranged to supply respective control voltages to each of said varactor diode and each said at least one additional varactor diode;
    a voltage generator, integrated as part of said synthesiser in a common semiconductor chip, which voltage generator includes a plurality of transistor cascades each of which includes: a first series of resistive elements;
    a first series of transistors, the control electrodes of which transistors are connected to corresponding ones of said resistive elements; a second series of transistors connected in series with said first series of resistive elements; and, a second series of resistive elements connected in series with said first series of transistors, respective resistive elements thereof being connected to respective control electrodes of said second series of transistors, the last resistive element thereof being connected to receive a common reference voltage; whereby, respective control voltages are made available at, or near the connections between said first series of transistors and said second series of resistive elements, in each transistor cascade.

6. A voltage generator, as claimed in claim 5, including
a buffer amplifier preceding each cascade; and,
a digital to analogue converter preceding each said buffer amplifier.

* * * * *